United States Patent [19]

Braden

[11] 3,982,047

[45] Sept. 21, 1976

[54] SOLDERING METHOD
[75] Inventor: Denver Braden, San Diego, Calif.
[73] Assignee: Illinois Tool Works Inc., Chicago, Ill.
[22] Filed: May 22, 1975
[21] Appl. No.: 580,099

Related U.S. Application Data

[62] Division of Ser. No. 569,634, April 18, 1975, which is a division of Ser. No. 467,528, May 6, 1974, abandoned.

[52] U.S. Cl. .............................. 427/123; 29/628; 427/258; 427/287; 427/319
[51] Int. Cl.² ...................................... C23C 17/00
[58] Field of Search ............ 427/123, 318, 319, 35, 427/284, 287, 431, 433, 435, 436, 35, 258, 313, 321; 118/641; 29/264, 628; 228/41, 51, 101, 212, 242, 243

[56] References Cited
UNITED STATES PATENTS

| | | |
|---|---|---|
| 1,655,960 | 1/1928 | Konig .................................. 228/41 |
| 2,568,242 | 9/1951 | Matteson ............................ 29/502 |
| 2,788,432 | 4/1957 | Moles ................................. 29/502 |

Primary Examiner—Thomas J. Herbert, Jr.
Assistant Examiner—Bruce H. Hess
Attorney, Agent, or Firm—Glenn W. Bowen; Robert W. Beart

[57] ABSTRACT

An automatic soldering machine and method for soldering the ends of pretinned components such as ceramic chip capacitors, transistors and the like, while leaving one side of the component flat, is disclosed. The components are supplied by a vibratory feeder to a pick-up station where they are sequentially picked up by a vacuum probe and are transferred to a print station where a retaining mechanism comprising a spring biased finger and a metal plate retains the component. A plurality of these retaining mechanisms are secured to an indexing table which passes in succession a printing station, a preheating station, a soldering station and a take-off station. At the soldering station a predetermined amount of solder is fed to the ends of the components and a heat lamp is flashed to melt the solder.

4 Claims, 11 Drawing Figures

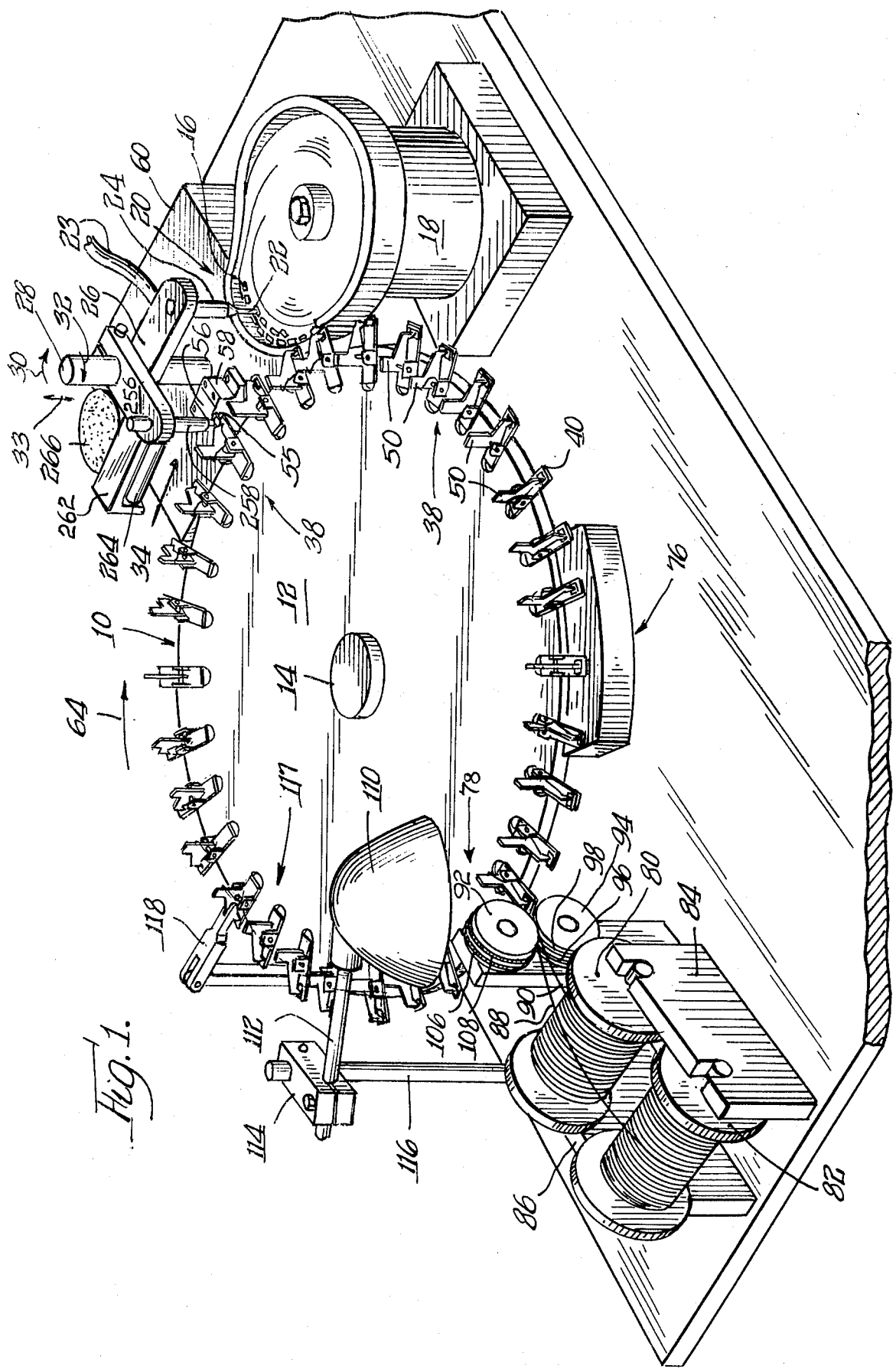

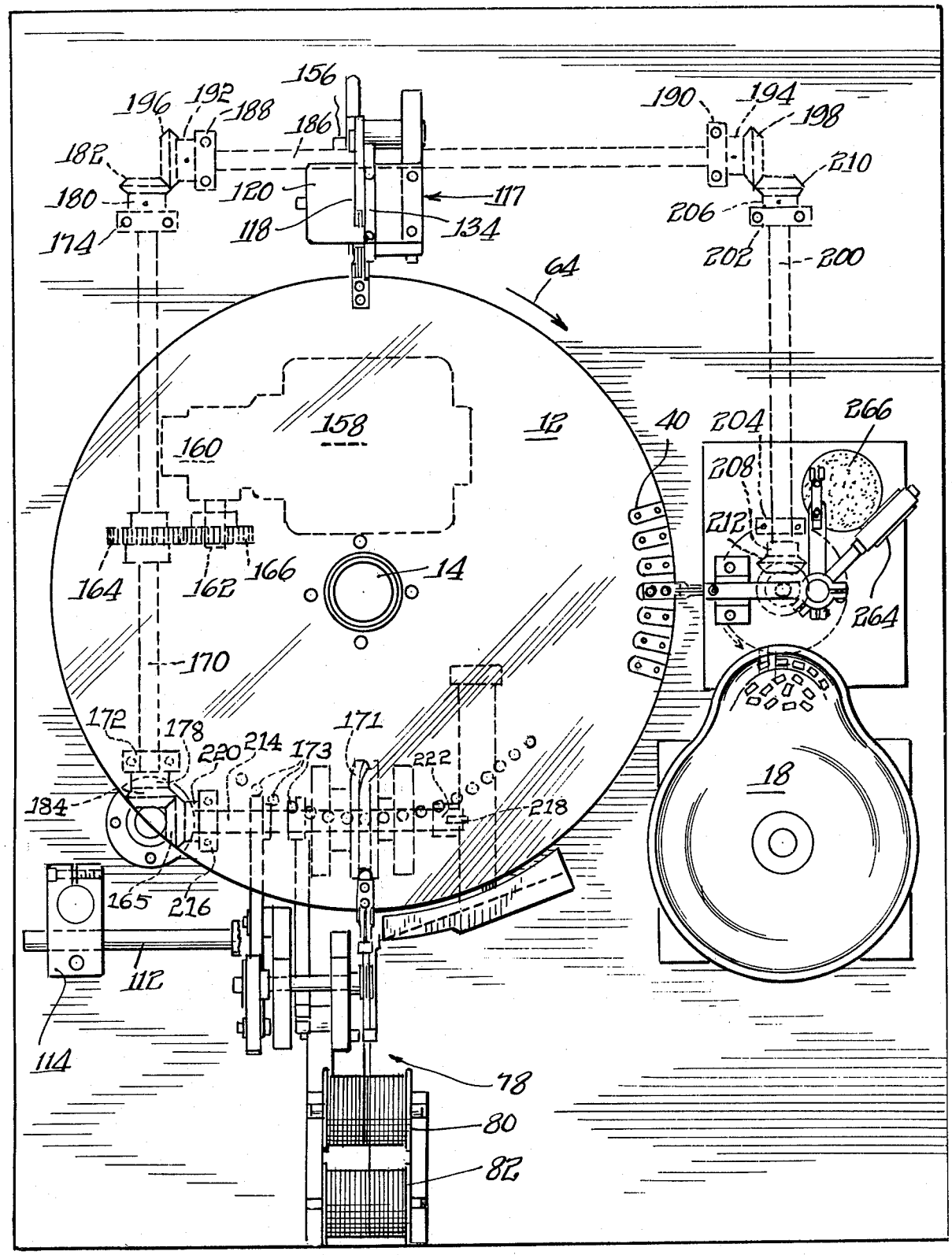

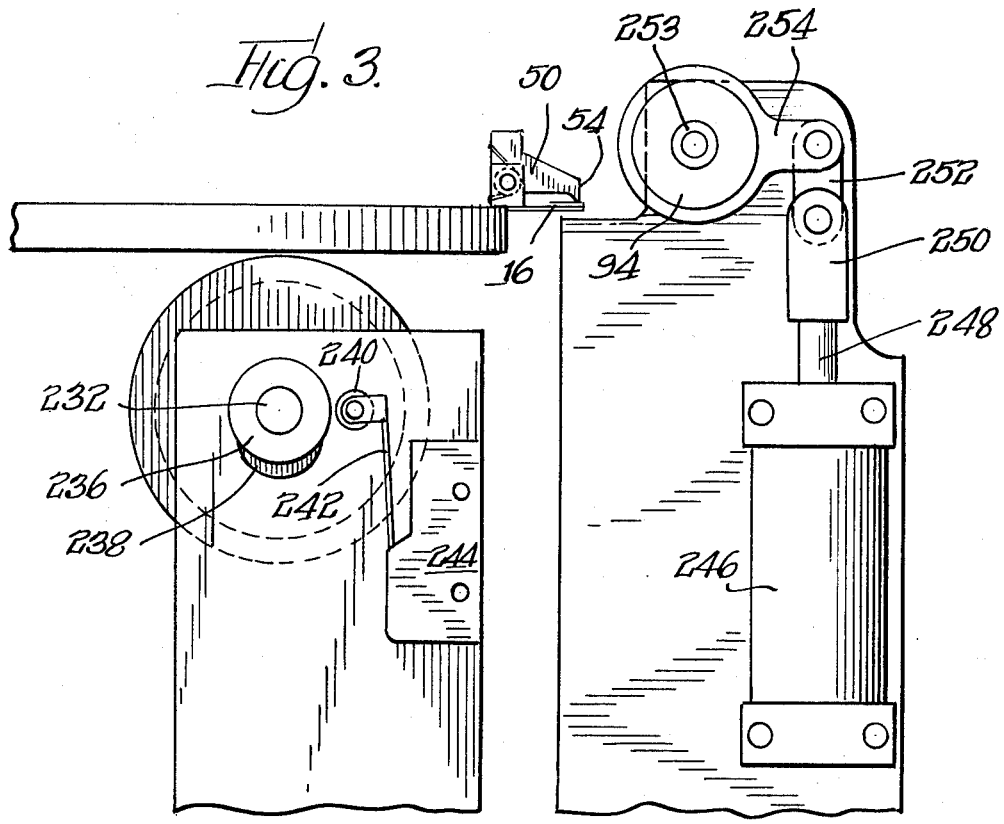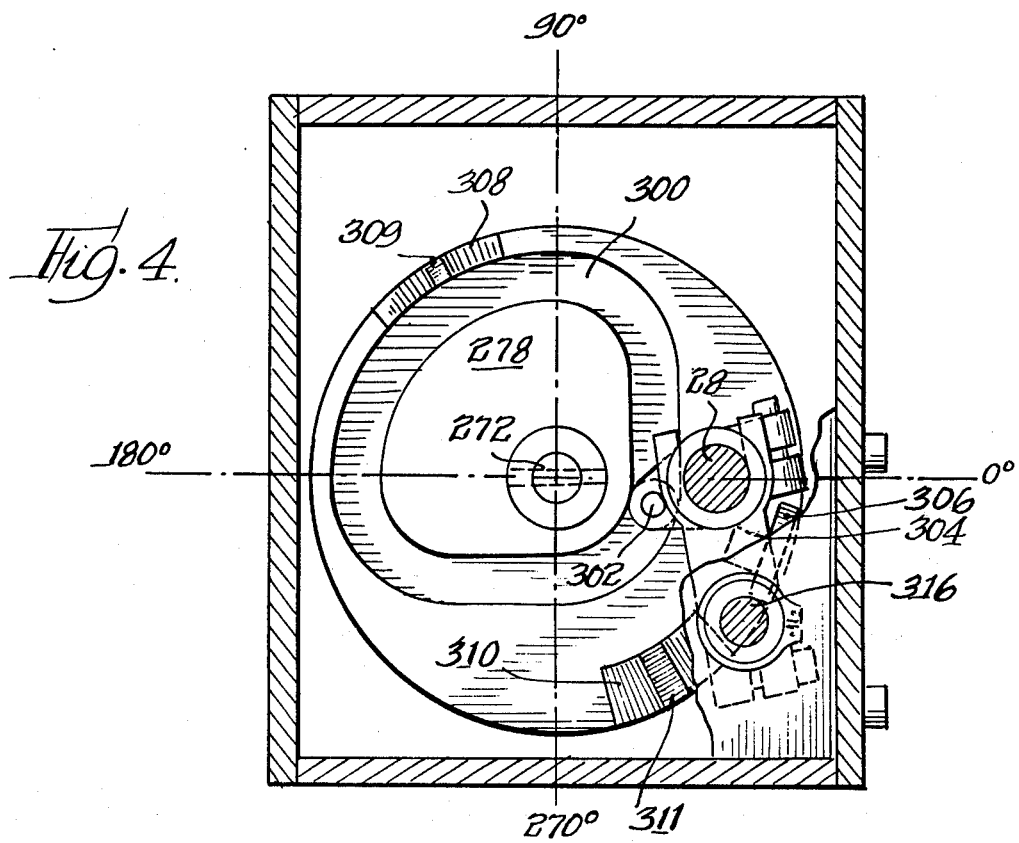

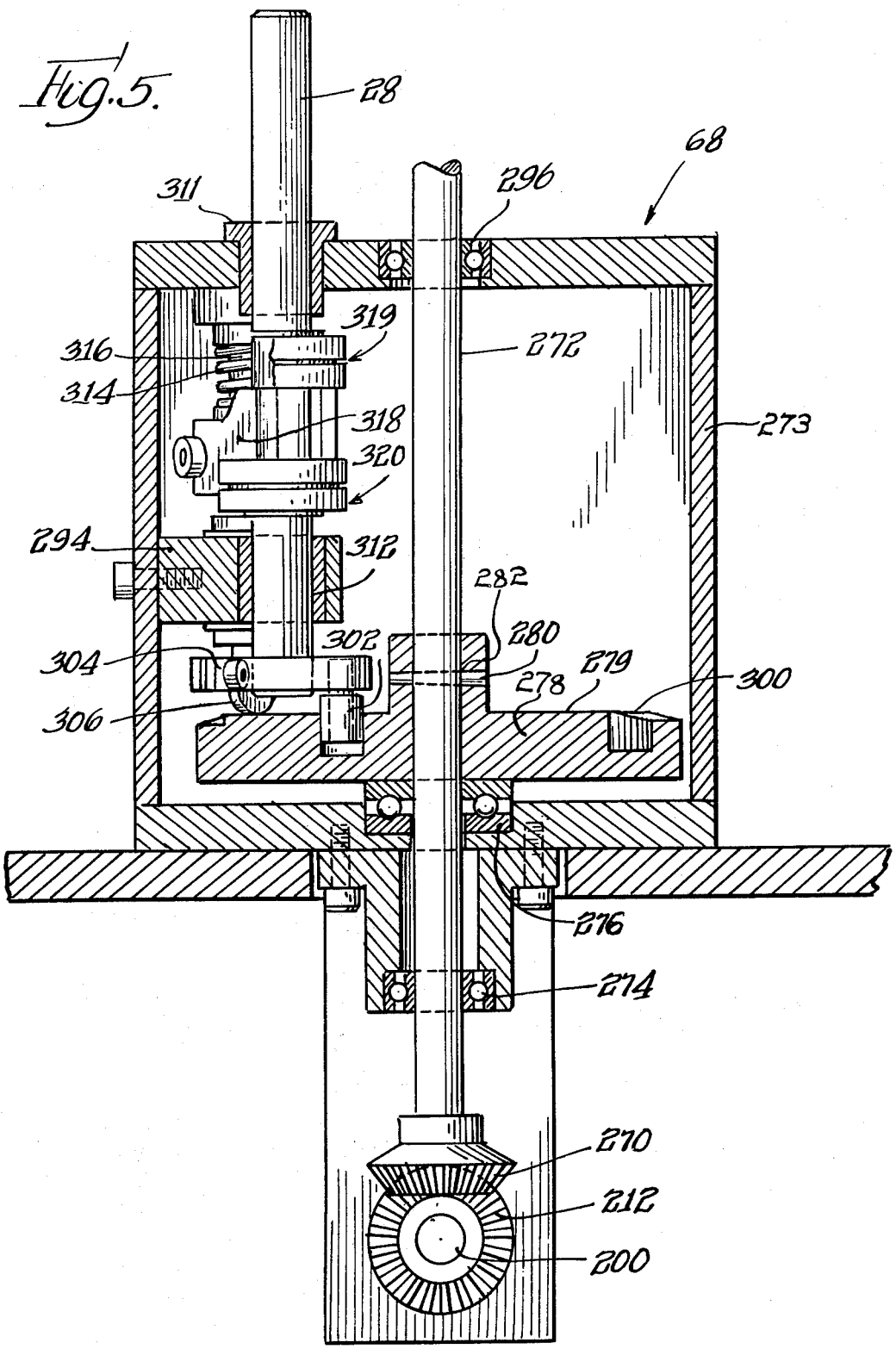

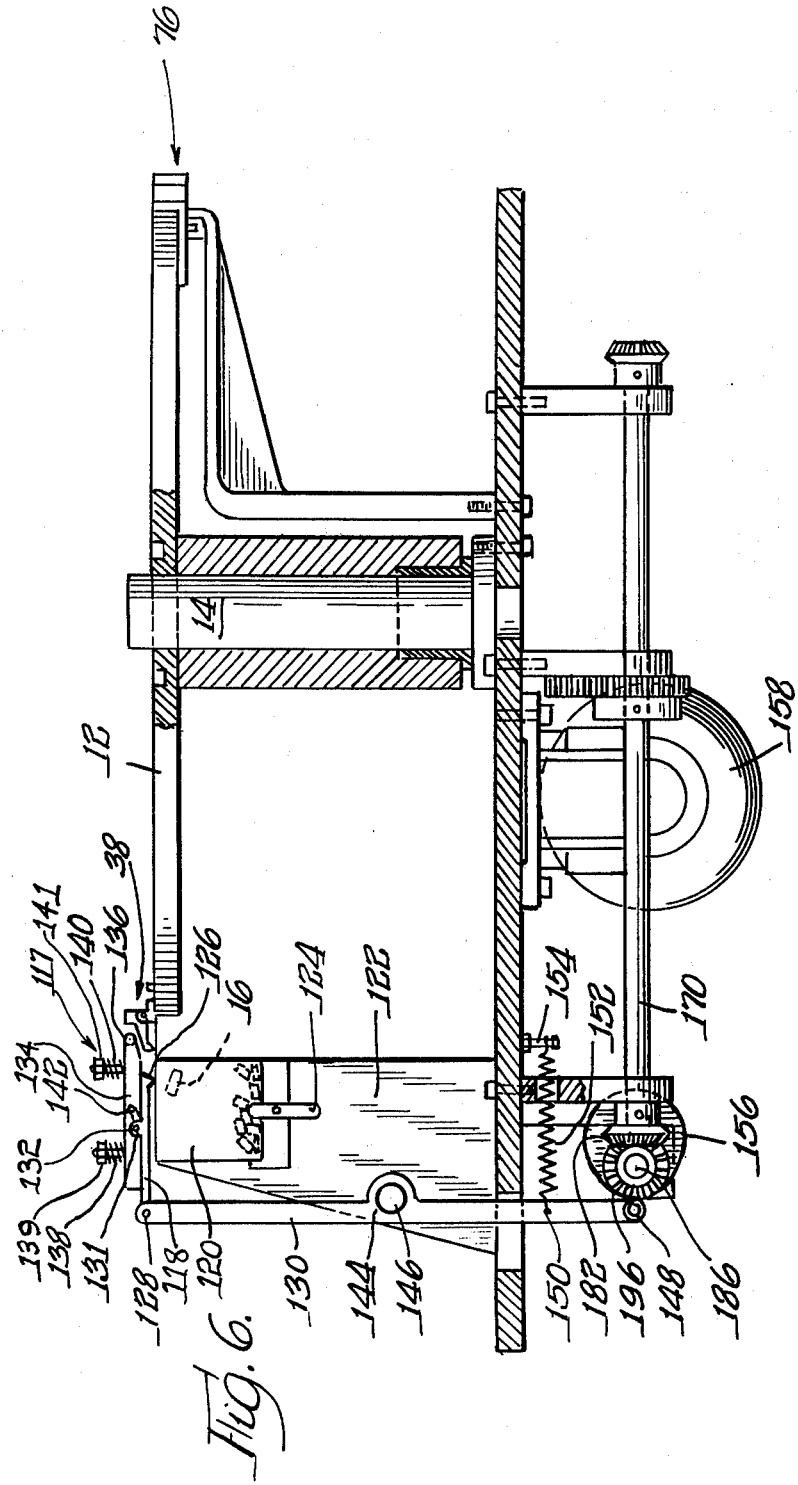
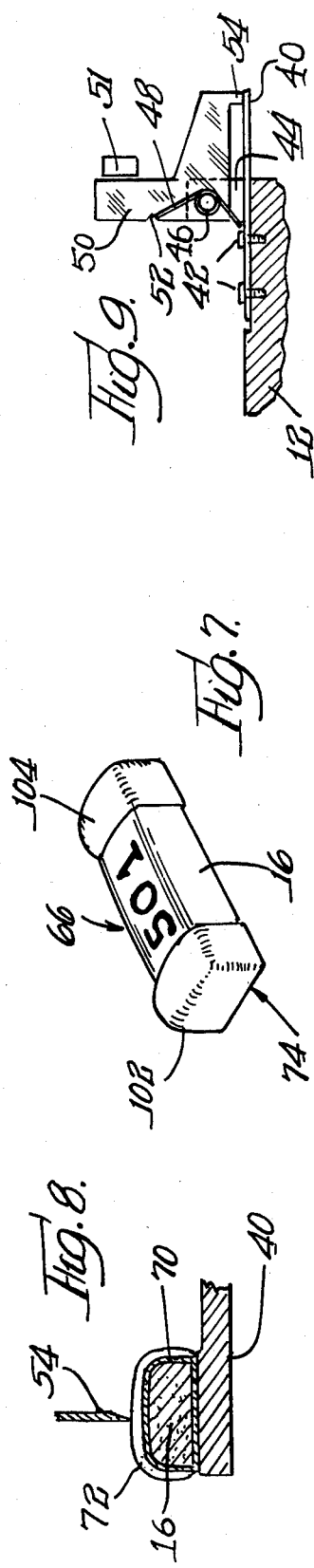

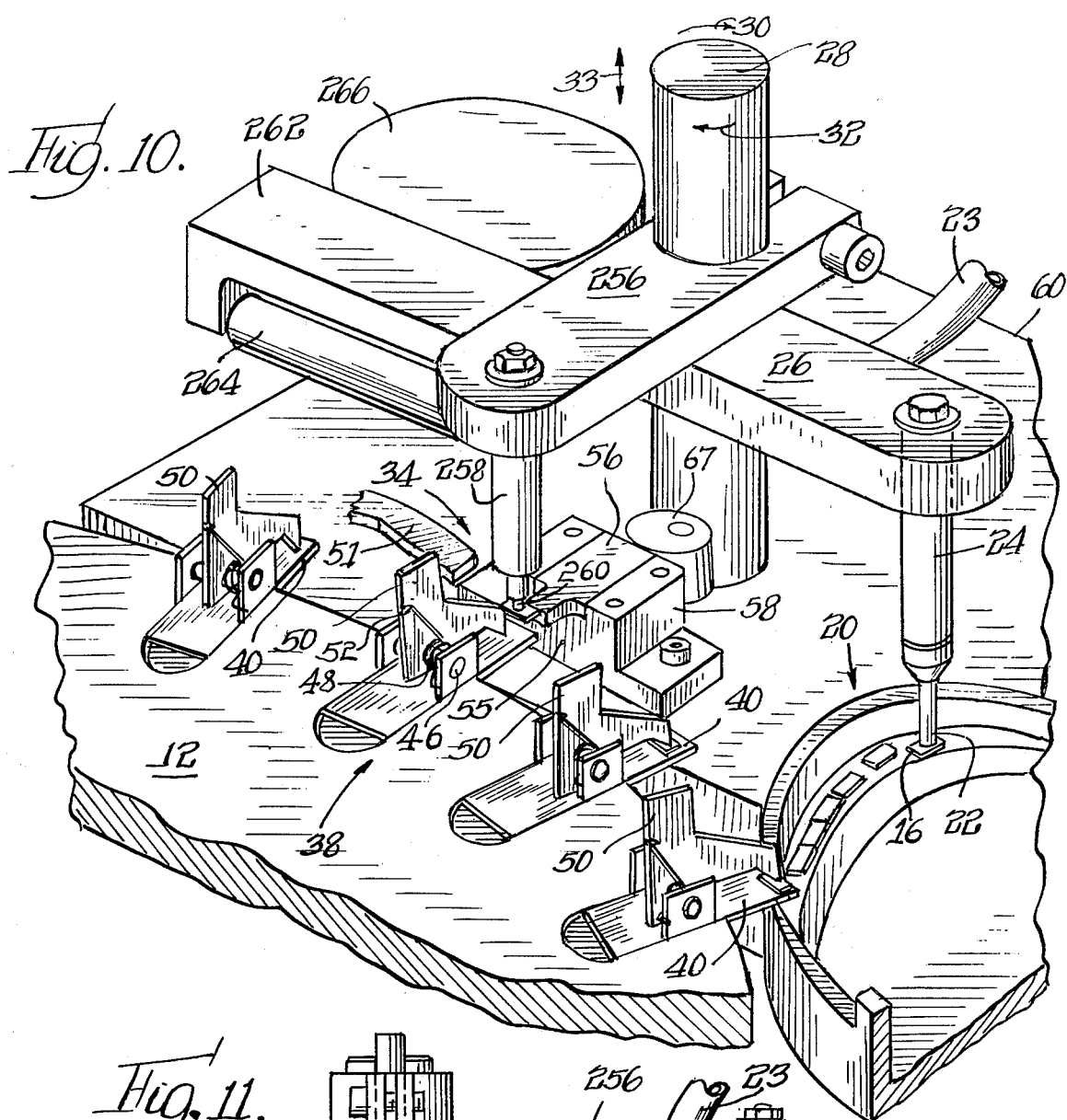
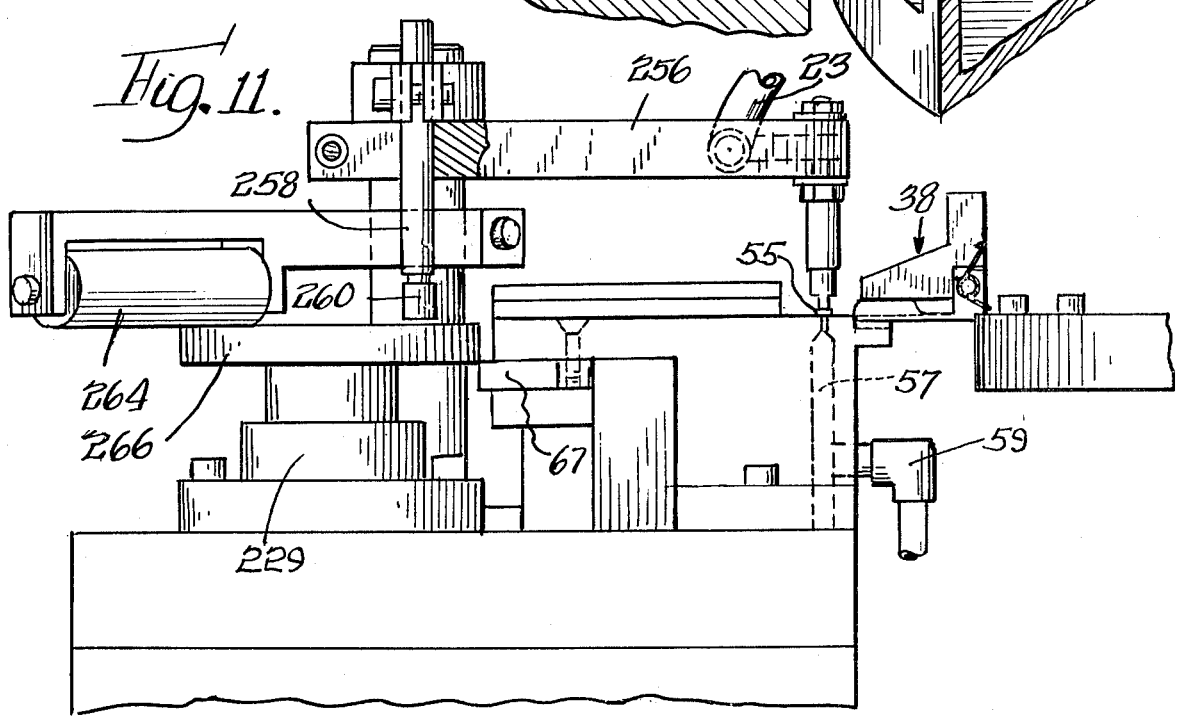

SOLDERING METHOD

This is a division of application Ser. No. 569,634, filed Apr. 18, 1975, which is a division of Ser. No. 467,528, filed May 6, 1974, now abandoned.

BACKGROUND OF THE INVENTION

Electronic components, such as ceramic chip capacitors are conventionally "tinned" or soldered at their ends by dipping the component in a solder bath. The amount of solder that can be applied in this manner is not sufficient to make adequate connections for some applications. Additional solder may be applied to the pretinned ends by conventional methods; but when the chip is to be mounted against a flat surface, such as a printed circuit board or holding clip, it is desirable that the surface that is to rest against the board or clip remain substantially flat. In addition, it is also desirable during the automatic processing of the electrical component to insure that one surface of the component remain flat so it will not roll off a carrying surface during automatic handling operations. Conventional methods of applying additional solder to a pretinned component do not allow one surface of the component to remain substantially flat. In manufacturing a component in accordance with the present invention, it is not necessary to employ a special layer of solder-repellant material which is bonded to the component, such as is shown in U.S. Pat. No. 3,482,303 to G. Trost, or to treat the lower surface with a special solder-repellant material that must be later removed.

It is, therefore, an object of the present invention to provide an automatic soldering machine and method by which a controlled amount of solder can be applied to the pretinned ends of an electronic component, which is in excess of the amount that can be obtained by conventional solder dip bath techniques.

It is an additional object of the present invention to provide an automatic soldering machine and method by which a controlled amount of solder can be applied to electronic components in such a manner that one surface of the component remains substantially flat.

DESCRIPTION OF THE DRAWINGS

FIG. 1 is an overall perspective view of an automatic soldering machine;

FIG. 2 is a plan view of the system of FIG. 1 with hidden elements shown by dotted lines;

FIG. 3 shows a timing cam and an air cylinder for feeding the solder to the component at the soldering station;

FIG. 4 shows a cam and cam follower which controls the vacuum pick-up mechanism and the printer for printing identification on the component;

FIG. 5 is a cross-sectional view of a printing apparatus for printing on the processed component;

FIG. 6 is a cross-sectional view of the automatic soldering system which shows the heating station and the take-off station;

FIG. 7 is a perspective view of an electronic chip capacitor which has been processed in accordance with the soldering machine of FIG. 1;

FIG. 8 is a partial cross-sectional view of the pretinned chip capacitor of FIG. 7;

FIG. 9 is a partial cross-sectional view which shows a retaining mechanism secured to the rotating table of FIG. 1;

FIG. 10 shows an enlarged view of the printing and pick-up portion of FIG. 1; and FIG. 11 shows a side view of the printer and the pick-up mechanism.

TECHNICAL DESCRIPTION OF THE INVENTION

With reference to FIG. 1, there is shown a soldering machine and printer which is constructed in accordance with the principles of the present invention. The soldering and printing apparatus 10 includes a large disc-shaped table 12 that indexes about a center shaft 14. As the table 12 indexes, various processing steps are undertaken.

Processing of electronic components 16, such as a ceramic chip capacitor, begins at the conventional vibratory feeder 18 which causes the components 16 to congregate at a pick-up station 20. A probe 22 is mounted at the ends of the tube 24 which is secured at its upper end to the arm 26. The probe 22 is connected to a source of vacuum (not shown) by the flexible hose 23. The arm 26 is secured to a shaft 28 which oscilates back and forth over 90° of rotation, as indicated by the arrows 30,32. The shaft 28, and hence the arm 26, is also displaced up and down, as indicated by the arrow 33, in a manner which will subsequently be described. Displacement of the arm 26 and the probe 22 up and down allows the component 16 to be picked up by the vacuum probe 22 and transferred over to a print station 34.

Once the components 16 have been fed to the print station 34, they are to be printed and fed to the indexing table 12 so that the sequence of processing steps necessary to manufacture a component 16 is achieved. Located at equal spaced intervals around the outer periphery of the table 12 are a number of retaining mechanisms 38. The retaining mechanisms 38 consist of a flat metal plate 40 which is secured to the table 12 by means of the screws 42. The plate 40 is formed with an upstanding bracket 44 which receives a shaft 46. A coil spring 48 is wound around the shaft 46 and a retaining finger 50 is also pivotly carried on the shaft 46. The spring 48 is secured to the finger 50 at a notch 52 so as to bias the finger 50 towards the plate 40. The lower tip 54 of the finger 50 is biased toward the outer edge of the lower plate 40.

The vacuum probe 22, in transferring the component 16 to the print station 34, deposits the component 16 on a loading platform 55. In order to load the component 16 between the plate 40 and the finger 50 of the retaining mechanism 38, a pusher member 56, which is slideably mounted in a block 58 which is secured to the frame 60, is employed. The pusher member 56, driven by the cam 57, pushes the component 16 towards the finger 50 so that it is wedged between the tip 54 of the finger 50 and the plate 40. A lever 51 (FIG. 10) driven by a cam (not shown) or other conventional means may be used to rotate the finger 50 in a counter-clockwise direction against the tension of the spring 48 to allow for receipt of the component 16 on the plate 40. The finger 50 and the plate 40 are preferably formed of a metal which can withstand heat and which rejects solder of a conventional lead-tin-antimony alloy, such as titanium, for example.

Prior to the time that the component 16 is loaded into the retaining mechanism, it is desirable to print identification markings, such as the identifying indicia 66 shown in FIG. 7, on it. This is accomplished by means of the printer which prints on the component 16 while it is on the loading platform 55. The printing mechanisms for printing on the component 16 is described in more detail subsequently. The component 16 is retained on the perforated loading platform 55 by means of a vacuum which is applied from the vacuum line 57 through the vacuum inlet coupling 59.

The components 16 that are loaded at the print station 34 travel around to the preheat station 76, which may be any type of conventional type of heater, in a clockwise direction as indicated by the arrow 64. The function of the preheat station 76 is to preheat the chips 16 as they pass over it in order to prevent thermal shock to the component 16 when hot solder is latter applied to it. This is especially desirable when the components 16 are chip capacitors in order to prevent cracking of the ceramic material. The preheating stage might be eliminated if thermal shock is not an important factor in the processing of the particular component.

After the component 16 has passed the preheat station 76, it is indexed to the soldering station 78. At the soldering station 78, two spools of solder 80,82 are allowed to freely rotate in the end brackets 84, 86. The tubes of solder 88,90 from the spools 80,82 are placed between the feed rollers 92,94. The lower feed roller 94 has a pair of guide grooves 96,98 in it which act to separate the solder tubes 88,90 so that they are properly spaced apart over the ends 102,104 of the component 16. The upper feed roller 92 has a pair of matching rings 106,108 which press against the solder tubes 88,90 in the guide grooves 96,98, respectively, and feed them towards the component 16 by a predetermined amount, in a manner described in more detail subsequently. The upper feed roller rings 106,108 may have a straight knurl on them to flatten and form serrations on the solder in order to aid in melting the solder back to a predetermined cut off point each time, if desired.

When the desired amount of solder has been fed over the ends 102,104 of the component 16, the high intensity focus lamp 110 flashes for a short time, thereby causing the solder to melt over the pretinned ends of the component 16 so as to form the relatively thick layers 72, shown in FIG. 8, over three sides of the component. The solder layer 72 does not flow to any substantial extent between the plate 40 and the flat surface 74 of the component 16 because of the downward pressure exerted on the component 16 by the finger 50 and the solder-repellant characteristic of the titanium metal used to construct the metal finger 50 and the metal plate 40. Electrical leads for the lamp 110 are supplied through the conduit 112, and the lamp is held into place by means of a support block 114 which in turn is supported by the rod 116.

After the components 16 have been soldered, they travel on the table 12 to the unloading or take-off station 117 where the finger 50 is rotated about the shaft 46 by a lever or by other conventional means similar to the level 51 so the pressure it exerted on the component 16 is removed. The unloading arm 118 then pulls the components 16 from the plate 40 and causes them to drop into a container 120 which is removably secured to the frame 122 by means of a latch 124. The details of the construction of the mechanism of the take-off station 117 is best shown by reference to FIG. 6. The unloading arm 118 has a downwardly protruding tip 126 at its forward end and it is pivotly mounted by means of a pin 128 at its rear end to a vertically oriented operating bar 130. Intermediate the ends of the unloading arm 118 there is a pair of upwardly projecting brackets 131 which receive a pivot shaft 132 for the arm 118. The shaft 132 also passes through a bias bar 134 which acts to maintain a downward pressure on the unloading arm 118.

The front end of the bias bar 134 pivots around the shaft 136 at its forward end, and a pair of springs 138,140 held down by the bolts 139,141 maintain a downwardly directed pressure on the bar 134. The bias bar 134 has a slot 142 in it which has a horizontal portion running toward the forward end of the bar 134 and an inclined portion. The slot 142 allows the bar 134 to undergo movement relative to the unloading arm 118, so the arm 118 can undergo the appropriate retraction movement necessary to pull the component 16 off of the plate 40 and drop it into the container 120. The upwardly directed inclined portion of the slot 142 allows the tip 126 to swing upwards when the arm 118 is directed forward, thereby allowing the tip 126 to be placed behind the component 16 so it can be carried toward the container 120 when the arm 118 is driven rearwardly.

The reciprocating rearward and forward motion of the unloading arm 118 for unloading the component 16 is obtained as a result of the motion of the bar 130 which has an aperture 144 intermediate the ends of the bar 130 to receive a pivot shaft 146. The lower end of the bar carries a cam follower 148, and an aperture 150 is provided between the pivot shaft 146 and the cam follower 148 for receiving one end of a bias spring 152, the other end of which is secured to a spring post 154 on the frame 122 so as to provide a counter-clockwise rotational bias to the lower end of the bar 130. The bias provided by the spring 152 causes the cam follower 148 to ride on the cam 156, which is driven by the drive train of the machine so that the upper end of the bar 130 and the unloading arm 118 will be driven forward and backward under the control of the cam 156.

An implementation of a drive system which is suitable for driving a machine constructed in accordance with the present invention is illustrated in FIG. 2. In operation of the machine, the table 12 is indexed, and the operation of the vacuum pick-up 22, the pusher member 56 and the printer is synchronized with the indexing table 12. In addition, the amount of solder that is fed over the components is controlled and the flash lamp 110 is activated at the proper time in order to deposit the required amount of solder on the ends of the component. It is further required that the retraction arm 118 by synchronized with the motion of the table 12 so that the components 16 are removed from the table at the take-off station 117 at the proper time.

Referring to FIG. 2, the illustrated drive system employs an electric motor 158 which is located beneath the table 12. At the forward end of the drive shaft of the motor 158 there is a drive gear box 160 which has a drive shaft 162 extending from it which carries the gear 166. An elongated shaft 170 is mounted at its end by means of the mounting brackets 172,174 and carries a gear 164 which meshes with the gear 166 so that it is driven in the bearings 178,180 which are located at the ends of the shaft 170. The extreme ends of the shaft 170 carry the bevel gears 182,184.

Extending in the horizontal direction, at a substantially 90° angle, from the shaft 170 is a second elongated shaft 186 which is mounted by means of the mounting brackets 188,190. The shaft 186 rotates in the bearings 192,194 and carries a bevel gear 196 at one end which is driven by the bevel gear 182 and another bevel gear 198 at its opposite end. The cam 156 which controls the motion of the operating bar 130 in the manner previously described is secured to the shaft 186.

Parallel to the shaft 170 is a relatively short shaft 200 which is mounted by means of mounting brackets 202,204. The shaft 200 rotates in the bearings 206,208 and the upper end of the shaft 200 carries a bevel gear 210 which is driven by the bevel gear 198. The opposite end of the shaft 200 carries a bevel gear 212 which is utilized to drive the printer and pick-up mechanism. A short shaft 214 runs parallel to the shaft 186. The shaft 214 is mounted by means of a bracket 216 and a stud 218 and it rotates in the bearings 220,222. One end of the shaft 214 carries the bevel gear 165 which is in mesh with the bevel gear 184 so that the shaft 214 is thereby driven by the gear 184. An index cam 171 is mounted on the shaft 214. The index cam 171 has a 90° of index portion and 270° dwell time portion. A series of index pins 173 extend down from the bottom of the table 12 and act as cam followers which are driven by the cam 171 to achieve indexing motion around the system for each processing step for the component 16.

At the soldering station 78, a predetermined amount of solder is positioned over both of the ends 102,104. The mechanism for achieving this is best illustrated in FIGS. 1 and 3. As previously described, the feed roller 94 is provided with the receiving grooves 96,98. The solder tubes 88,90 from the spools 80,82 are initially fed into the grooves 96,98, respectively. The upper roller 92 is a driven roller which has motion imparted to it from the air cylinder 246 which is energized only if a component 16 is present to receive solder. This is controlled by means of a rotating cam 236 that is secured to the shaft 200 which has a high section 238 that periodically engages the roller 240 on the actuating arm 242 of an electrical switch 244. When the switch 244 is activated by deflection of the lever 242 by the "high" section 238 of the cam 236, the electrically operated air cylinder 246 is activated. The air cylinder 246 is coupled by means of a rod 248 and a pair of linkage arms 250,252 to a roller support member 254 which houses a one-way clutch 253. Activation of the cylinder 256 causes the rod 248 to be driven downwardly thereby driving the two feed rollers 94 which results in the solder tube 88,90 being trapped between the rings 106,108 and the grooves 96,98 so that they are fed forward until the air cylinder 246 reaches a predetermined stop (not shown).

It is desirable that printed indicia be applied to the surface of components 16 while they are being processed in accordance with the described soldering machine. The printing should appear on the surface of the component 16 which is opposite to the flat surface 74. It is also desirable that this printing be accomplished with a minimum of handling of the components. It is, therefore, desirable that the components be picked up and fed to the print station 34 and printed while they are at the print station and then fed into the processing system so that a separate pick up operation is not necessary. In order to achieve this it is desirable to integrate the pick up apparatus and the printer into one mechanism.

Referring to FIG. 5, the oscilating shaft 28 carries the support arm 26 for the vacuum pick-up 22; a support arm 256 for the rod 258 which carries the rubber printing element 260 at its lower end; and a support arm 262 for the ink roller 264 which has an elongated axis. The arms 26,256 and 262 are positioned so that the arms 26 and 262 are substantially 180° apart on the shaft 28 and the arm 256 is substantially normal to the arms 26 and 262. As the printing mechanism operates the arms 26,256 and 262, the shaft undergoes 90° rotational motion back and forth. This allows for the component 16 to be picked up at the pick-up station 20 by the probe 22, which is then lifted and rotated to the print station 34 so that the component 16 may be deposited on the loading platform 55. As the shaft 28 rotates through the 90° arc, the arm 262 brings the roller 264 into contact with the platten 266. The platten 266 is secured to a shaft 272 which rotates on the counterclockwise stroke of the roller 264 to smooth out the ink on the platten 266. Rotation of the platten 266 occurs on only the counter-clockwise stroke of the roller 264 because of the one-way clutch 229 mounted on the platten shaft 272. At the time the pick-up probe 22 is transferring the component 16 to the loading platform 55 by lowering the probe 22 to the platform 55, the printing element 260 is brought into contact with the platten 266 to pick up ink. The printing element 260 is then withdrawn upwardly from the platten 266 and the probe 22 is lifted from the loading platform 55. The shaft 28 then roates 90° counter-clockwise and the ink roller 264 again traverses the platten 266 as the printing element 260 is brought to the print station 34 at the platform 55. The printing element 260 is then brought down into contact with the component 16 on the loading platform 55 in order to print the indicia 66 on the component 16 on the loading platform 55 at the same time the probe 22 is lowered into the pick-up station 20 to pick up a new component 16.

The shaft 28 is driven upwardly and downwardly twice in each cycle of operation to allow for pick up of a new component and printing of a previous deposited component during each cycle. In the illustrated embodiment of FIG. 5 it is seen that the bevel gear 212 on the shaft 200 drives a bevel gear 270 which is secured to the bottom of the drive shaft 272 for the printer unit 68. The drive shaft 272 revolves in the bearings 274,276 and 296. A cam 278, which is shown in FIG. 3, is secured to the shaft 272 in the housing 273 by means of a taper pin 280 which projects through an opening 282 in the shaft. The upper end of the shaft 272 carries the cam 67 which actuates the pusher 56.

The cam 278 is provided with a continuous cam groove 300 which receives a cam follower 302 which is secued to a support arm 304 on the lower end of the shaft 28. The support arm 304 also carries a wheel 306 which rides on the outer edge of the cam 278. The upper surface 279 of the outer edge of the cam 278 has two indentions 308,310 which control the elevation of the wheel 306 and hence the elevation of the shaft 28. The motion of the cam follower 302 in the groove 300 controls the oscilating motion of the shaft 28 so that upon each 360° revolution of the shaft 272 and the cam 278, the shaft 28 will rotate 90° in a clockwise direction and will return in a counter-clockwise direction to its initial position.

The shaft 28, which passes through the support member 294 and the bearings 311,312 is biased downwardly by the spring 314 which surrounds an auxiliary shaft 316 that extends parallel to the shaft 28. The spring 314 acts against the coupling member 318, and the wheel 306 is, therefore, biased downwardly toward the upper surface 279 of the cam 278 by the spring 314. The cam surfaces 308,310 on the outer periphery of the cam 278 interact with the wheel 306 so as to raise and lower the shaft 28 at the appropriate times so that vacuum pick-up probe 22 will be inserted and removed from the pick-up station 20 and will be displaced upwardly and downwardly at the proper time at the printing station 34 while the printing element 260 is correspondingly lowered and raised over the platten 266 to pick up ink, and is subsequently lowered and raised to print on the component 16 at the printing station 34. The cam surfaces 308,310 gradually decline to their lowest point at the center areas 309,311 of the cam surfaces 308,310 and they each extend for approximately 40° of the circumference of the cam 278. The lowest portions of the center areas 309,311 are approximately 2° of the circumference of the cam 278 in width. Thus, the shaft 28 will be raised and lowered in a gradual manner to its lowest point in the center of the cam surfaces 308,310.

The cam groove 300 is positioned so that the arm 304 will be displaced so as to cause rotation of the shaft 28 as the cam 278 rotates 360° in a clockwise direction. Over the 90° to 180° segment of rotation of the cam 278; and the 270° to 360° segment of the cam 278, there will be no displacement of the arm 304 because of the constant radius of the cam groove 300 between these segments. Over the 90° to 180°; and the 270° to 360° segments of the cam 278, although the arm 304 is not rotated, the shaft 28 will be lowered and raised due to the interaction of the wheel 306 and the cam surfaces 308,310.

Thus, from 0° to 90° of rotation of the cam 278, the shaft 28 will rotate in a clockwise direction and from 180° to 270° rotation of the cam 278, the shaft 28 will rotate in a counter-clockwise direction due to the movement of the arm 304. From 90° to 180° of rotation of the cam 278, the shaft 28 will displaced downwardly due to the interaction of the cam surface 308 and the wheel 306, until the wheel 306 is at the center area 309 and then the shaft 28 will be raised upwardly before the cam 278 reaches the 180° rotation line. When the wheel 306 is in contact with the center area 309 of the cam surface 308, the printing element 260 will be inked and the vacuum pick-up probe 22 will deposit a new component 16 onto the loading platform 55.

The wheel 306 and the shaft 28 will remain elevated as the cam 278 rotates from 180° to 270°, and the shaft 28 will be returned in a counter-clockwise direction to its initial position. As the cam 278 rotates from 270° to 360° the wheel 306 will be lowered into the center area 311 of the cam surface 310; and the printing element 260 will be brought into contact with the component 16 so as to print the indicia 66 on it while the vacuum probe 22 will be lowered into the pick-up station 20 so it can pick up a new component 16 for processing. The roller 264 is positioned so that it comes into contact with the platten 266 in order to smooth out the ink on the platten 266 as the shaft 28 oscilates back and forth. The platten 266 is rotated about 15° on each counter-clockwise stroke of the ink roller 264. The cam surfaces 308,310 may be shifted relative to the positions shown in FIG. 4, if desired, when conditions are such that the timing between the back and forth oscilation of the shaft and the up and down motion of the shaft dictate such a shift.

The invention is claimed as follows:

1. A method of applying solder to contact means of an electrical component having a flat contact surface comprising the steps of placing said flat contact surface of said component against an independent support member of a solder rejecting material that is not secured to said component, while leaving the remaining portion of said contact means exposed, and applying a predetermined amount of melted solder over the exposed portion of said contact means while simultaneously forcing said flat contact surface of said component against said independent support member with a force sufficient to prevent any substantial amount of solder from flowing between said flat contact surface of said component and said support member so that said entire contact means is covered with solder except for said flat contact surface.

2. A method as set forth in claim 1 comprising the additional step of preheating said component before said melted solder is applied to said contact means.

3. A method as set forth in claim 1 comprising the additional step of pretinning the entire surface of the contact means with a layer of solder that is substantially thinner than the partial layer of solder that is applied over said thin layer while said component is being forced against said support member.

4. A method as set forth in claim 3 comprising the additional step of preheating said component before said melted solder is applied to said contact means.

* * * * *